(12) United States Patent
Mennemann et al.

(10) Patent No.: US 9,701,568 B2
(45) Date of Patent: Jul. 11, 2017

(54) HIGHLY REFRACTIVE THIN GLASSES

(71) Applicant: Schott AG, Mainz (DE)

(72) Inventors: Karl Mennemann, Taunusstein (DE); Uwe Kolberg, Mainz (DE); Holger Wegener, Alfeld (DE); Monika Gierke, Wiesbaden (DE); Ute Woelfel, Mainz (DE); Joerg Fechner, Mainz (DE)

(73) Assignee: SCHOTT AG, Mainz (DE)

( * ) Notice: Subject to any disclaimer, the term of this patent is extended or adjusted under 35 U.S.C. 154(b) by 122 days.

(21) Appl. No.: 14/217,787

(22) Filed: Mar. 18, 2014

(65) Prior Publication Data

US 2014/0284577 A1  Sep. 25, 2014

(30) Foreign Application Priority Data

Mar. 20, 2013 (DE) ......................... 10 2013 102 848

(51) Int. Cl.
| | |
|---|---|
| C03C 3/066 | (2006.01) |
| C03C 3/093 | (2006.01) |
| C03C 3/078 | (2006.01) |
| C03C 3/062 | (2006.01) |
| C03C 3/068 | (2006.01) |
| H01L 51/50 | (2006.01) |
| C03C 3/089 | (2006.01) |
| H01L 51/00 | (2006.01) |
| H01L 51/52 | (2006.01) |
| C03B 29/00 | (2006.01) |
| C03C 3/097 | (2006.01) |

(52) U.S. Cl.
CPC .............. *C03C 3/093* (2013.01); *C03B 29/00* (2013.01); *C03C 3/062* (2013.01); *C03C 3/066* (2013.01); *C03C 3/068* (2013.01); *C03C 3/078* (2013.01); *C03C 3/089* (2013.01); *C03C 3/097* (2013.01); *H01L 51/0096* (2013.01); *H01L 51/50* (2013.01); *H01L 51/5275* (2013.01); *Y02E 10/549* (2013.01); *Y02P 70/521* (2015.11)

(58) Field of Classification Search
None
See application file for complete search history.

(56) References Cited

U.S. PATENT DOCUMENTS

| | | | | | |
|---|---|---|---|---|---|
| 4,481,299 | A | * | 11/1984 | Tajima | .................... C03C 3/062 501/73 |
| 4,699,827 | A | * | 10/1987 | Baudry | .................... H01B 3/08 257/E21.505 |
| 5,108,785 | A | * | 4/1992 | Lincoln | ............... H01L 21/4807 347/1 |
| 5,300,467 | A | * | 4/1994 | Ishizaki | .................. C03C 3/064 501/67 |
| 2011/0001159 | A1 | * | 1/2011 | Nakamura | ............. B82Y 20/00 257/98 |
| 2011/0287264 | A1 | | 11/2011 | Wada et al. | |
| 2012/0114904 | A1 | | 5/2012 | Yanase et al. | |
| 2012/0194064 | A1 | | 8/2012 | Wada et al. | |
| 2013/0011607 | A1 | * | 1/2013 | Mushiake | ........... H01L 51/0096 428/141 |
| 2014/0179510 | A1 | * | 6/2014 | Allan | ...................... C03C 3/091 501/67 |

FOREIGN PATENT DOCUMENTS

| | | | | |
|---|---|---|---|---|
| DE | 19827568 C1 | * | 1/2000 | ............. C03C 3/089 |
| GB | 2447637 B | | 11/2009 | |
| WO | 02051757 A2 | | 7/2002 | |
| WO | 03051783 A1 | | 6/2003 | |
| WO | 2012055860 A2 | | 5/2012 | |

OTHER PUBLICATIONS

Machine translation of JP 11-106234, Hikata, Apr. 1999.*

* cited by examiner

*Primary Examiner* — David Sample
(74) *Attorney, Agent, or Firm* — Ohlandt, Greeley, Ruggiero & Perle, L.L.P.

(57) ABSTRACT

Thin glasses having high refractive index ($n_d$), a layer composite assembly made from these thin glasses, a method for the production of the thin glasses, and the uses of the thin glasses are provided. The thin glasses are processed in an in line manufacturing process and have the optical properties of a classical optical glass. The thin glasses are highly transparent, crystallization-resistant, chemically resistant and highly refractive. The viscosity/temperature behavior of the thin glasses is adjusted to the manufacturing process via in line flat glass methods.

19 Claims, No Drawings

HIGHLY REFRACTIVE THIN GLASSES

CROSS REFERENCE TO RELATED APPLICATIONS

This application claims benefit under 35 U.S.C. §119(a) of German Patent Application No. 10 2013 102 848.9, filed Mar. 20, 2013, the entire contents of which are incorporated herein by reference.

BACKGROUND OF THE INVENTION

1. Field of the Invention

This invention relates to thin glasses having high refractive index ($n_d$), a layer composite assembly comprising these thin glasses, a method for the production of the thin glasses and their uses.

2. Description of Related Art

Glasses having refractive indices of above $n_d$=1.5 up to $n_d$=1.7 are quite known. However, in the field of technical glasses these values are achieved by the addition of high amounts of lead oxide which is highly questionable from an ecological point of view and also detrimental in the case of economical large-scale processes. Known classical optical glasses with optical positions in the higher refractive index region which are used for light and image guides and thus fulfil the requirements of the classical application fields (i.a. imaging, microscopy, medical technology, digital projection, photolithography, optical communications engineering, optic/illumination in the automotive sector) normally are manufactured as a bulk material due to the geometry of their products which are produced from them (lenses, prisms, fibers i.a.). So, standard formats of the manufacturing process of optical glasses are sections of bars from continuous bar production, fiber core glass rods as well as optical blocks. With respect to the smallest geometric dimension normally a thickness (sections of bars) or a diameter (fiber core glass rods) of 20 mm are minimum dimensions which are considered to make sense in an economic and applicative point of view, and desirable are thicknesses of equal to or higher than 40 mm and in the case of optical blocks these values start at about 150 mm.

Technical glasses (produced according to technical processes of hot forming) typically have refractive indices of about 1.50. Glasses having refractive indices of higher than 1.6 are normally not suitable for technical processes of hot forming, because mostly they have a "steep" viscosity curve (strong change of viscosity with temperature) and mostly a high tendency to crystallization. In the case of the production of bars the tendency to crystallization is not a problem, because the glass melts are cooled down in such a short time that no crystallization takes place. In this context the quick increase of the viscosity with decreasing temperature is in fact an advantage.

Exactly these properties of the classical optical glasses are different from the properties of the technical standard glasses, the physicochemical property profiles of which are specifically tailored for the technical parameters of the manufacturing aggregates of technical glasses, such as flat glasses, thin glasses and tubular glasses, which are significantly larger in comparison to the manufacturing aggregates of optical glasses.

Technical glasses normally have a "long" viscosity profile, which means that their viscosity does not vary very much with changing temperatures. This is the reason for the longer times of the respective single processes and for generally increased process temperatures, which in the case of large technical aggregates has a less marked negative influence onto the profitability. Furthermore, there are also significantly increased lifetimes of the materials in the aggregates due to the flow conditions and the size of the aggregate. This is a very critical point for glasses with a high tendency to crystallization. Long glasses are advantageous in continuous large aggregates, since these glasses can be processed in a greater temperature range. So it is not necessary that the method is adjusted to the fastest possible processing of the glass which is still hot.

In the case that it would be intended to produce classical optical materials using a technical standard process for the production of flat glass (e.g. drawing, overflow fusion, down draw, rolling), the chemical composition of the optical glasses has to be changed, normally reduced in its content of that components which impart the desired optical properties to the optical glasses. Such measures would for example be the reduction of the proportions of $TiO_2$, $ZrO_2$, $Nb_2O_5$, $BaO$, $CaO$, $ZnO$, $SrO$ or $La_2O_3$. This indeed results in longer glasses with less susceptibility to crystallization, but also in a remarkable loss of refractive index and dispersion properties.

A further problem is that the flat/thin glass processes being favored at the moment due to economic reasons involve certain chemical requirements for the glasses to be processed which cannot be fulfilled by the classical optical glasses: For example, in a floating process no components which are susceptible for redox reactions are allowed to be present in the glass. Thus for example, it is not allowed to use optical standard components such as the oxides of lead, bismuth, tungsten as well as the classical polyvalent refining agents (arsenic), the actual effect of which exactly is the shift of the redox equilibrium.

So in total in a contradictory manner these two classical groups of materials, the optical and the technical glasses, are different with respect to their processability.

There are numerous uses for thin glasses having a high refractive index besides the classical fields of application. Of course, there is the possibility to produce such thin glasses by reworking a bar of optical glass. But it is obvious that the steps of cutting and polishing of such bar sections are extremely expensive and in addition stress the glass very strongly. Thus, very small thicknesses of glasses with large dimensions cannot be achieved. When thin glasses are mechanically polished, then the surface properties are not optimal.

WO 2012/055860 A2 relates to transparent layer composite assemblies comprising opto-technical hybrid glasses having refractive indices of higher than 1.6. But the hybrid glasses described there do not contain zinc oxide. The reason is that it has been assumed that zinc oxide would result in crystallization during the hot forming step. But indeed, zinc oxide in combination with an appropriate amount of barium oxide is able to effectively prevent crystallization and thus is able to allow an economic production.

GB 2,447,637 B relates to an OLED layer composite assembly which may be used for illumination or display purposes. But in this case a substrate glass having a refractive index of only about 1.5 is used. The disadvantages associated therewith have to be weakened with an antireflection layer.

US 2012/0114904 A1 relates to flat glass containing iron oxide which may be used in OLEDs. In this glass the special ratio of BaO to ZnO is not fulfilled, because the glasses contain much more BaO than ZnO. Due to the different composition these glasses in comparison to the thin glasses according to the present invention have much higher melting temperatures and also hot processing temperatures. As a consequence the respective melts significantly stronger attack the refractory material used. In addition, the absence of enclosures in and the geometric uniformity of the final products are compromised.

US 2012/194064 A1 describes a diffusion layer for OLEDs. The glass used there contains much $Bi_2O_3$ and less $SiO_2$ and BaO. The same applies to US 2011/287264 A1.

Especially for the use as a substrate or superstrate in an OLED or a photovoltaic module it is important that no or only less total reflection occurs between a flat glass and an adjacent layer. The refractive index of the glass used should be as high as possible, because in many applications in layer composite assemblies the glass is adjacent to a layer having high refractive index, such as for example ITO in OLEDs. When the light created in the OLED exits, then the light from the ITO layer has to enter into the superstrate made of glass. The higher the difference of the refractive index between the ITO layer and the glass, the more distinct is the total reflection at the interface. Thus, here economically produced thin glasses having high refractive indices can advantageously be used.

SUMMARY

It is the object of this invention to provide a thin glass which can be processed in an in line manufacturing process and at the same time has the optical properties of a classical optical glass. In other words: the glass should combine the processability of a technical glass and the optical properties of an optical glass.

The thin glasses of this invention are highly transparent, crystallization-resistant, chemically resistant and highly refractive. Their viscosity/temperature behavior is adjusted to the manufacturing process of in line flat glass methods.

DETAILED DESCRIPTION

The glass of this invention is a flat glass, in particular a flat glass having a low thickness of preferably less than 2 mm (hereafter "thin glass"). The thin glasses according to the present invention are different from the classical optical glasses not only in their thicknesses, but also in their surface properties. This is a result of their production methods by which they can be obtained. In an experiment of producing classical optical glasses with thicknesses of 2 mm or less, certain problems would occur according to the chosen production process. As described above, due to the shortness of the glasses and their tendency to crystallization in large-scale in line manufacturing methods a result would be achieved which would not be satisfactory. But when on the other hand the glasses would be produced from bar sections by cutting and polishing, this would result in high costs and also in surface properties which can hardly fulfil the requirements of such a glass. The thin glasses of this invention have refractive indices of >1.60 and preferably even >1.65.

The thin glasses of this invention can be produced with in line manufacturing methods due to their composition. In line manufacturing methods of this invention are in particular down draw, overflow fusion, floating and rolling. Particularly preferable are down draw and overflow fusion. With these manufacturing methods thin glasses with particular surface properties can be produced. The thin glasses comprise at least one, in particular two fire-polished surfaces due to the manufacturing methods via which they can be obtained. Fire-polished surfaces are very smooth, i.e. their roughness is very low. In the case of fire-polishing in contrast to mechanical polishing a surface will not be abraded, but the material to be polished is heated to such a high temperature that it flows and thus becomes smooth. Therefore the costs for the production of a smooth surface by fire-polishing are much lower than for the production of a highly smooth mechanically polished surface.

With the in line manufacturing methods according to the present invention thin glasses with at least one fire-polished surface are obtained. When for the production a down draw or overflow fusion method is used, then the glasses obtained even have two fire-polished surfaces.

Referred to the thin glass according to the present invention, the term "surfaces" means the upper and/or lower sides, thus both faces which in comparison to the residual faces are the largest.

Fire-polished surfaces are featured by a particularly low roughness. The roughness of a fire-polished surface is lower than that of a mechanically polished surface.

The fire-polished surface(s) of the thin glasses of this invention preferably have a root mean square roughness ($R_q$ or also RMS) of at most 5 nm, preferably at most 3 nm and particularly preferably at most 1 nm. The depth of roughness $R_t$ of the thin glasses is preferably at most 6 nm, further preferably at most 4 nm and particularly preferably at most 2 nm. The depth of roughness will be determined according to DIN EN ISO 4287.

In the case of mechanically polished surfaces the roughness values are worse. Furthermore, in the case of mechanically polished surfaces with the help of an atomic force microscope (AFM) polishing traces can be observed. In addition, also with the help of an AFM residues of the mechanic polishing agent, such as diamond powder, iron oxide and/or $CeO_2$, can be observed. Since mechanically polished surfaces have to be cleaned after a polishing step, leaching of certain ions at the surface of the glass occurs. This depletion of certain ions can be detected with the help of secondary ion mass spectrometry (ToF-SIMS). Such ions are for example Ca, Zn, Ba and alkali metals.

The thin glass of this invention has a thickness of less than 2 mm, preferably at most 0.8 mm and more preferably at most 0.6 mm. Particularly preferable, the thickness is at most 0.35 mm and in particular at most 0.2 mm. Such a thin glass is sufficiently elastic to e.g. allow flexible OLED layer composite assemblies. To guarantee a sufficient stability, the thickness should preferably be at least 0.02 mm.

In order that the thin glasses of this invention can be produced with in line manufacturing methods, with respect to their crystallization properties they should meet certain parameters. In the case of classical optical glasses these parameters are not so important, because normally the optical glasses are cooled down very quickly. Thus, the optical glasses are quickly cooled down from a temperature above the upper devitrification limit (OEG) to a temperature below the lower devitrification limit (UEG).

But during the processing with in line manufacturing methods the glasses are at relatively high temperatures for a long period of time. Therefore, the thin glasses according to the present invention should have such a resistance against crystallization that they even do not show any crystals respectively do not show visible crystals, when they are exposed to temperatures of 800° C. to 1050° C. (OEG/60) for a period of time of 60 minutes. This test is conducted in a calibrated gradient furnace according to the Pt support metal sheet method. According to the present invention visible crystals are crystals with a diameter of higher than 10 µm.

The thin glasses of this invention contain relatively low amounts of $SiO_2$. On the one hand, $SiO_2$ is an important component in the glass, because it reduces the steepness of the viscosity curve. But on the other hand, when the amount of $SiO_2$ is high, only relatively lower amounts of such components which effectively increase the refractive index can be added. Therefore, the thin glasses of this invention only contain amounts of $SiO_2$ of up to 60% by mol, preferably only up to 56% by mol, further preferably up to 52% by mol and particularly preferably up to 50% by mol. But the thin glasses of this invention also have to fulfil certain requirements with respect to chemical stability and steepness of the viscosity curve, so that at least 30% by mol, preferably at least 32% by mol, further preferably at least 38% by mol and particularly preferably at least 43% by mol of $SiO_2$ are contained in the thin glass.

The thin glasses of this invention may contain $B_2O_3$, preferably in a proportion of at least 6% by mol and at most 20% by mol. In preferred embodiments the amount of this component is at most 17% by mol, further preferably at most 15% by mol and particularly preferably at most 8% by mol. When the proportion of $B_2O_3$ in the preferred glass is too low, then the viscosity of the glass is too high. But when the amount of $B_2O_3$ is too high, then the required chemical resistance cannot be achieved. This is a critical point for the processability of the glass, e.g. in the semiconductor process (e.g. purification). In addition, high proportions of $B_2O_3$ in the glass increase the contamination of the glass with refractory material during the production thereof. This results in inhomogeneity, scattering, heterogeneous nuclei and in turn crystallization.

$B_2O_3$ (like $SiO_2$) is a glass former; it is advantageous, when the content of $SiO_2$ and $B_2O_3$ is selected such that the sum of $SiO_2$ and $B_2O_3$ is in a range of 40 to 65% by mol. Further preferable is a sum in a range of 45 to 60% by mol and particularly preferable in a range of 48 to 55% by mol. When this amount exceeds these preferable values, then glasses with a refractive index which is too low are obtained. When this amount falls below these values, then this would result in a glass which would tend to crystallization and would have a bad chemical resistance.

An important criterion with respect to the desired refractive index and the necessary crystallization stability is a balanced ratio of the components $SiO_2$ and BaO in the thin glass according to the present invention. This ratio of $SiO_2$ to BaO is a molar ratio of quantities of substances and is preferably at least 1.5 and at most 3.8, further preferably at least 1.8 and at most 3.0 and particularly preferably at least 2.5.

The component BaO is an essential constituent of the thin glasses according to the present invention. BaO supports the high refractive index. For this purpose BaO is contained in the thin glass according to the present invention in a proportion of at least 10% by mol and most 25% by mol. Preferably, the content of BaO is at least 12% by weight and more preferably at least 15% by mol. But proportions which are too high may result in decreased chemical resistance and increased tendency to crystallization of the glasses, which absolutely has to be avoided, when the production methods being preferred according to the present invention are used. Therefore, the content of BaO is preferably limited to at most 22% by mol, further preferably at most 19% by mol.

The glass of this invention comprises ZnO in a content of at least 10% by mol and at most 25% by mol. Further preferable is a minimum content of ZnO of at least 12% by mol, more preferably at least 14% by mol and particularly preferably at least 16% by mol. A minimum content of ZnO is necessary for obtaining a high refractive index. The content should not be too high, because then the glasses become too "short" and cannot be produced any longer by the technical HFG process. Therefore, the content of ZnO should not exceed a value of 21% by mol and in particular preferably 19% by mol.

For the adjustment of a very good refractive index besides a good viscosity behavior and good crystallization stability it has been proved that it makes sense to use ZnO in such amounts that in relation to $SiO_2$ the molar ratio of quantities of substances of ZnO to $SiO_2$ is at least 0.1 and at most 0.8, further preferably at least 0.25 and at most 0.65. In particularly preferable embodiments this ratio is at most 0.5.

Optimum refractive indices are achieved, when the components ZnO and BaO which increase the refractive index are used in the thin glass in total amounts of preferably at least 25% by mol and more preferably at least 30% by mol. As already mentioned, there is the risk that a content of these components which is too high and is unavoidably at the expense of the content of $SiO_2$ results in reduced crystallization stability. Therefore, the total amount of the components ZnO and BaO is preferably limited to at most 40% by mol and in particular at most 35% by mol.

An optimum result with respect to the properties crystallization, viscosity and refractive index has been achieved with a mixture of the components increasing the refractive index, in which the molar ratio of quantities of the substances BaO to ZnO was lower than 1.5 and preferably lower than 1.2 as well as particularly preferably lower than 1.05. This molar ratio of quantities of substances should preferably be at least 0.5 and particularly preferably at least 0.8 or even at least 0.9. Obviously the compliance with this ratio particularly contributes to the producibility of the glasses according to the present invention via an in line manufacturing process.

$Al_2O_3$ increases the chemical resistance of the glass. It is contained in the thin glasses according to the present invention in amounts of preferably up to 6% by mol, further preferably up to 4% by mol and particularly preferably up to <1% by mol. When the proportion of $Al_2O_3$ is too high, then the melting temperatures of the glass increase, resulting in increased energy consumption and decreased aggregate lifetimes. Therefore, in embodiments of the invention the thin glass according to the present invention is free of $Al_2O_3$.

It is preferable that the thin glasses according to the present invention comprise $Li_2O$ in contents of only 0 to 2% by mol. This component may be used for the exact adjustment of the viscosity properties. In combination with $B_2O_3$ this component may strongly attack the production facilities which results in cloudiness, formation of heterogeneous nuclei and short lifetimes of the aggregates. In addition, $Li_2O$ results in increased ion mobility, and furthermore it increases the tendency of the glass to crystallization. In addition, the chemical resistance of the glass is reduced. Therefore, preferable thin glasses are free of $Li_2O$.

The thin glasses according to the present invention may comprise $K_2O$. $K_2O$ is used for the exact adjustment of viscosity. Preferably, it is contained in the glass in amounts of 0 to 8% by mol, in particular up to 4% by mol or only up to 1% by mol. Like in the case of $Li_2O$, a proportion in the glass which is too high results in increased ion mobility and low chemical resistance, so that preferable thin glasses do not contain any $K_2O$.

The thin glasses according to the present invention may contain $Na_2O$. $Na_2O$ is used for the exact adjustment of viscosity. Preferably, it is contained in the glass in amounts of 0 to 10% by mol, in particular up to 4% by mol or only up to 1% by mol. Like in the case of $Li_2O$, a proportion in the glass which is too high results in increased ion mobility and low chemical resistance. Therefore, preferable embodiments are free of $Na_2O$.

From the above paragraphs it can be learned that the content of alkali metal oxides in the thin glass according to the present invention should be limited to avoid leaching effects during the processing thereof. This is the reason, why the proportion of the alkali metal oxides $Li_2O$, $Na_2O$ and $K_2O$ is preferably limited to a content of at most 4% by mol, further preferably at most 2% by mol. Thus, the thin glasses according to the present invention preferably do not comprise respectively only comprise low proportions of alkali metal oxides which may be introduced by unavoidable impurities in the raw materials. Alkali metal oxides reduce the chemical resistance of the glass.

Some embodiments of the thin glasses comprise MgO. Preferably, the content thereof is up to 3% by mol, further preferably up to 2% by mol. MgO is used for the adjustment of the viscosity of the glass. When the amount of MgO is too high, then the tendency of the glasses to crystallization is increased. Therefore, preferable embodiments are free of MgO.

The thin glasses may comprise SrO. Then, it is contained in amounts of up to 12% by mol or up to 11% by mol, but in preferable embodiments the content is at most 10% by mol or at most 8% by mol, to adjust the viscosity of the glass. When the amount of SrO is too high, then this results in glasses which are too short.

The thin glasses of this invention may contain CaO to adjust the dependence of the viscosity from the temperature. For this purpose CaO is used in amounts of up to 10% by mol, wherein preferable embodiments comprise up to 8% by mol. When the amount of CaO is too high, then this results in a glass which is too short.

For an optimum adjustment of the length of the glass the proportion of the sum of the oxides BaO, SrO, CaO, MgO and ZnO together should preferably be a value of 30 to 50% by mol, further preferably 35 to 46% by mol and most preferably 39 to 44% by mol.

For increasing the refractive indices of the thin glass, $TiO_2$ and/or $ZrO_2$ may be used. In such a case the content of $TiO_2$ is preferably 0 to 9% by mol and particularly preferably 1 to 6 by mol. In particularly preferable embodiments at least 3% by mol of $TiO_2$ are used. With the addition of $TiO_2$ and/or $ZrO_2$ also the chemical stability is improved.

The content of $ZrO_2$ is preferably 0 to 5% by mol and particularly preferably 0.25 to 4% by mol or up to 3% by mol. When these components are used in too high amounts, then the tendency of the glasses to crystallization is increased. In a particularly preferable embodiment of this invention the thin glasses comprise both components, $TiO_2$ and $ZrO_2$, wherein preferably the content of $TiO_2$ is always higher than the content of $ZrO_2$. In particularly preferable embodiments the content of $TiO_2$ is even higher than twice as much of that of $ZrO_2$.

The glasses according to the present invention may comprise $Y_2O_3$ in amounts of 0 to 7% by mol. But preferable embodiments are free of $Y_2O_3$. Furthermore, the thin glasses may contain $Nb_2O_5$, preferably in a proportion of 0 to 9% by mol, further preferably 0.25 to 5% by mol or up to 3.5% by mol or up to 3% by mol. A further optional component is $La_2O_3$ which may be used in a content of 0 to 10% by mol and particularly preferably 0.1 to 5% by mol. The components mentioned in this paragraph are used for the adjustment of the high refractive indices which are required according to the present invention. But it has to be considered that the amounts of these components which are used have to be limited, since otherwise the tendency to crystallization increases too much. It has been shown that it is advantageous to use the oxides which are discussed here ($Y_2O_3$, $Nb_2O_5$, $La_2O_3$) in the thin glasses according to the present invention in total amounts of 0 to 8% by mol, preferably 0 to 5% by mol. It has also to be considered that these components which are mentioned here are extremely expensive, and also due to this reason the used amounts should be limited.

In order that the high refractive index of the thin glasses according to the present invention can be achieved, the glass composition is preferably selected such that the sum of the components which strongly increase the refractive index, $TiO_2$, $ZrO_2$, $Nb_2O_5$, $La_2O_3$, $Y_2O_3$, is at least 2.5% by mol, further preferably at least 3% by mol, more preferably at least 4% by mol. But this sum should not exceed a value of preferably 15% by mol, further preferably 12% by mol, more preferably 9.5% by mol and particularly preferably 8% by mol, to restrict the tendency to crystallization.

When in this description is mentioned that the glasses are free of a component or that they do not contain a certain component, then this means that this component may only be present as an impurity in the glasses. This means that it is not added or contained in significant amounts. According to the present invention, insignificant amounts are amounts of less than 1000 ppm, preferably less than 500 ppm and most preferably less than 100 ppm. Preferably, the thin glasses according to the present invention are free of components which are not mentioned in this description as a glass constituent. In particular, the thin glasses of this invention are preferably free of PbO, since PbO is a component which is harmful to the environment and health. Furthermore, the glass is preferably free of $Bi_2O_3$, since this component strongly increases the tendency to crystallization and the costs of the raw materials of the glasses and reduces transmittance. The glass preferably does not contain $Fe_2O_3$, since $Fe_2O_3$ reduces transmittance.

In addition, common refining agents such as in particular $SnO_2$, $Sb_2O_3$, sulfates and/or chlorides may be added to the thin glass for refining.

$As_2O_3$ may also be added, but due to toxicological reasons and reasons of harmfulness to the environment it is preferably omitted.

As already mentioned above, the glasses according to the present invention have relatively low melting and hot processing temperatures. The hot processing temperatures (VA) of the glasses according to the present invention are preferably lower than 1000° C., further preferably in a range of 800° C. to 1000° C. and particularly preferably in a range of 820° C. to 970° C. Low processing temperatures prevent the aggregates from damage and thus increase the cost effectiveness of the production.

The melting temperatures of the glasses—expressed by the temperatures at which the glasses have a viscosity of $10^2$ dPas—according to the present invention are preferably in a range of at least 800° C. and at most 1150° C., further preferably in a range of at least 900° C. and at most 1100° C.

The glass-transition temperatures (Tg) of the glasses according to the present invention are preferably in a range of higher than 550° C., further preferably higher than 600° C. and preferably lower than 750° C., further preferably lower than 700° C.

Preferably, the thin glasses of this invention are prepared by a flat glass method. The method according to the present invention comprises the following steps melting of a mixture of glass comprising the following components in % by mol

|  | from | to |
|---|---|---|
| $SiO_2$ | 30 | 60 |
| $B_2O_3$ | 0 | 20 |
| ZnO | 10 | 25 |
| BaO | 10 | 25; and | processing of the glass melt into a thin glass.

The processing of the glass melt into a thin glass is preferably conducted via an in line manufacturing method respectively flat glass method. It is particularly featured by a step of processing of the glass melt in the molten state, without any cooling down before.

Preferably, the flat glass methods are down draw or overflow fusion. Other methods like floating and rolling are also possible, but due to a trend to worse glass surfaces they are not preferred. If the glass should be floated, then in addition redox-specific properties of certain single components have to be considered. Therefore, this hot forming process is not preferred.

The flat glass methods according to the present invention are preferably so-called in line methods in which the thin glass is melted and immediately thereafter formed. So the thin glass will not be cast into bars first and then processed, but directly after the melting step it is formed into a thin glass.

Preferable methods are the down draw as well as the overflow fusion method. The down draw method is described in WO 02/051757 A1 and the overflow fusion method is described in WO 03/051783 A1.

In the down draw method a glass melt flowing out of a drawing tank through a nozzle, optionally with the use of a drawbar, is formed into a glass sheet which is drawn down to the desired thickness and width by rolls being arranged at the side.

In the overflow fusion method a glass melt is guided into an overflow tray from which the glass melt at at least two sides flows over the rim thereof (overflow). Both sheets of the flowing down glass melt run down the walls of the overflow tray and combine (fusion) at the lower part of the pointed walls to a glass sheet.

In both methods the glass melt is maintained and moved in a liquid state for a relatively long period of time. Because of that the risk of crystallization is relatively high. Thus, the aspect of crystallization has to be particularly considered. Another important aspect is the temperature/viscosity profile of the glasses. The processing shows much better results, when the glasses in the case of decreasing temperatures do not become too viscous in a short period of time and when the processing temperature is not too high. The glasses of this invention are featured by these properties, and as a consequence the conduct of the process can be designed more stable as well as the service life expectancy of the production facilities used (draw tanks, overflow fusion channel etc.) can distinctly be increased.

Also according to the present invention is a layer composite assembly, comprising at least one of the thin glasses of this invention. The layer composite assembly is preferably transparent or at least transparent from at least one side.

The layer composite assembly according to the present invention preferably comprises a semiconductor layer and two electrodes. In such a case an electrode may be a conductive transparent oxide layer (e.g. ITO) or also an electrode of silver nanowires which through its arrangement allow electric conduction. The layer composite assembly preferably further comprises a substrate or superstrate layer, wherein the substrate layer or the superstrate layer comprises or consists of the thin glass according to the present invention.

Since the thin glasses according to the present invention normally only contain very low amounts of alkali metal oxides, in a preferable embodiment of the layer composite assembly between the thin glass and the semiconductor layer no blocking or barrier layer is necessary. Normally, in the case of certain semiconductor layers this blocking layer is necessary to avoid diffusion of alkali ions into the semiconductor layer. Alkali ions diffusing into the semiconductor layer may result in defects up to a complete failure of the system (e.g. in the case of uses in a TFT display).

A system with glass substrates on both sides of the layer composite assembly is also possible, wherein such a system is particularly preferable in transparent OLED illumination systems, or also to achieve a hermetic encapsulation of an OLED or PV system with the glass.

In preferable embodiments the layer composite assembly is used for the assembly of a light-generating OLED system.

A layer composite assembly according to the present invention comprising the thin glass according to the present invention as a substrate or superstrate layer is generally particularly suitable for all uses in which radiation such as e.g. visible light, UV, IR or other radiation should be guided through the system and one or more layers have an increased refractive index, wherein at the interface between the layer(s) reflections may occur.

Generally, these uses are e.g. optical and in particular semiconductor uses, e.g. OLED systems (as display and in particular also as illuminant for area illumination). Another semiconductor use is e.g. thin layer photovoltaics, particularly preferable organic thin layer PV.

In alternative embodiments the layer composite assemblies according to the present invention may also be used in solar modules or as solar modules. It is obvious that with the help of the glasses which are used according to the present invention also for solar modules advantageous properties in the layer composite assembly can be achieved, because also in this case a passage of light without hindrance through a substrate glass is important. Thus, with the use of these layer composite assemblies solar modules with improved effectiveness can be obtained. Also in such solar modules the layer composite assembly is used in combination with electrodes.

The thin glass according to the present invention can be produced via a flat glass process. According to the present invention "flat glass process" preferably means a process which results in glass with a below-described aspect ratio (thickness to surface area) of panes. These panes are featured by minimum thicknesses of 0.02 mm (thinnest glasses) over standard thicknesses of 0.1 to 1 mm, up to thicknesses of 3 mm. Preferably, the widths are between 0.1 and 3 m. The kind of the flat glass process varies with the intended aspect ratio between the preferred methods, down draw and overflow fusion and related processes. So according to the present invention the required thickness of the thin glass in the substrate layer is achieved. With common optical glasses having a refractive index of >1.6 these flat glass processes cannot be conducted, because they contain components and/or comprise compositions which result in low crystallization stability of the glasses.

The substrate layer in the layer composite assembly has preferably a layer thickness of less than 3 mm. Further preferably, this layer thickness is less than 2 mm and particularly preferably less than 1 mm or less than 0.5 mm. In the preferred flexible form of the layer assembly the layer thickness is preferably <500 μm, particularly preferably <200 μm. This is advantageous, because the elasticity of the glass increases with decreasing thickness. So with increasing thickness the layer composite assembly in total would become less elastic. But when the layer thickness is chosen to small, then on the one hand the processability is hampered and on the other hand the layer composite assembly in total is less resistant against damage. Therefore, the layer thickness of the substrate layer is preferably at least 0.03 mm and further preferably at least 0.05 mm. The advantageous elasticity of the thin glass is achieved by suitable selection of the ingredients.

Preferably, the layer composite assembly is a constituent of an OLED illumination system (illuminant). Also according to the present invention is the use of the glasses according to the present invention as substrate glasses for an OLED and/or in an OLED illumination system.

Also according to the present invention is the use of a glass according to the present invention in the form of a thin glass as a substrate or superstrate, in particular in a layer composite assembly comprising a semiconductor layer. Preferred is a use in an above-described layer composite assembly.

EXAMPLES

The following examples show synthesis compositions of the thin glasses of this invention as well as some parameters of these glasses. The given data are in % by mol, except for ratio data. The given ratios refer to molar ratios of quantities of substances.

|  | I | II | III | IV | V | VI | VII | VIII | IX |
|---|---|---|---|---|---|---|---|---|---|
| $SiO_2$ | 47.15 | 47.16 | 46.63 | 47.10 | 47.10 | 40.86 | 54.58 | 47.64 | 50.67 |
| $B_2O_3$ | 6.70 | 6.83 | 6.75 | 6.82 | 6.82 | 11.52 |  | 6.89 | 7.33 |
| $Al_2O_3$ |  |  |  |  |  |  |  |  | 3.05 |
| CaO | 7.15 | 7.15 | 7.07 | 7.14 |  |  |  | 7.21 |  |
| SrO |  |  |  |  | 7.14 | 7.25 | 6.84 |  |  |
| BaO | 16.46 | 16.47 | 16.28 | 16.44 | 16.45 | 16.68 | 15.74 | 16.63 | 17.13 |
| ZnO | 17.06 | 17.06 | 16.88 | 17.04 | 17.04 | 17.29 | 16.32 | 17.24 | 18.34 |
| $TiO_2$ | 3.42 | 2.56 | 4.38 | 3.41 | 3.41 | 4.32 | 4.89 |  |  |
| $ZrO_2$ | 0.68 | 1.32 | 1.30 | 0.68 | 0.68 | 1.38 | 0.98 | 3.02 | 0.74 |
| $La_2O_3$ |  |  |  |  |  |  |  |  |  |
| $Nb_2O_5$ | 1.36 | 1.46 | 0.70 | 1.36 | 1.36 | 0.69 | 0.65 | 1.38 | 2.75 |
| $SiO_2/BaO$ | 2.86 | 2.86 | 2.86 | 2.86 | 2.86 | 2.45 | 3.47 | 2.86 | 2.96 |
| $ZnO/SiO_2$ | 0.36 | 0.36 | 0.36 | 0.36 | 0.36 | 0.42 | 0.30 | 0.36 | 0.36 |
| ZnO + BaO | 33.52 | 33.53 | 33.16 | 33.48 | 33.49 | 33.97 | 32.06 | 33.87 | 35.47 |
| BaO/ZnO | 0.96 | 0.97 | 0.96 | 0.96 | 0.97 | 0.96 | 0.96 | 0.96 | 0.93 |

|  | X | XI | XII | XIII | XIV | XV | XVI | XVII | XVIII |
|---|---|---|---|---|---|---|---|---|---|
| $SiO_2$ | 47.45 | 34.43 | 33.82 | 43.42 | 39.57 | 33.49 | 32.49 | 46.63 | 30.92 |
| $B_2O_3$ | 6.87 | 16.01 | 15.71 | 7.83 | 11.23 | 15.58 | 15.04 | 6.75 | 14.14 |
| $Al_2O_3$ |  |  |  |  |  |  |  |  |  |
| CaO | 7.19 |  |  |  |  |  |  | 7.07 |  |
| SrO |  | 6.57 | 9.08 | 7.20 | 7.29 | 6.60 | 9.13 |  | 9.19 |
| BaO | 16.57 | 17.19 | 16.89 | 16.67 | 16.78 | 17.25 | 16.98 | 16.28 | 17.09 |
| ZnO | 17.18 | 17.82 | 17.51 | 17.28 | 17.40 | 17.87 | 17.60 | 16.88 | 17.72 |
| $TiO_2$ | 1.20 | 4.89 | 4.81 | 3.46 | 4.35 | 4.91 | 4.83 | 4.38 | 5.30 |
| $ZrO_2$ | 0.69 | 1.42 | 1.40 | 1.04 | 1.39 | 1.43 | 1.41 | 1.30 | 1.59 |
| $La_2O_3$ | 1.49 | 0.89 |  | 1.73 | 1.16 | 2.08 | 1.75 |  | 2.92 |
| $Nb_2O_5$ | 1.37 | 0.78 | 0.77 | 1.38 | 0.83 | 0.78 | 0.77 | 0.70 | 1.13 |
| $SiO_2/BaO$ | 2.86 | 2.00 | 2.00 | 2.60 | 2.36 | 1.94 | 1.91 | 2.86 | 1.81 |
| $ZnO/SiO_2$ | 0.36 | 0.52 | 0.52 | 0.40 | 0.44 | 0.53 | 0.54 | 0.36 | 0.57 |
| ZnO + BaO | 33.75 | 35.01 | 34.40 | 33.95 | 34.18 | 35.12 | 34.58 | 33.16 | 34.81 |
| BaO/ZnO | 0.96 | 0.96 | 0.96 | 0.96 | 0.96 | 0.97 | 0.96 | 0.96 | 0.96 |

|  | I | II | III | IV | V | VI | VII | VIII | IX |
|---|---|---|---|---|---|---|---|---|---|
| $n_d$ | 1.67522 | 1.676 | 1.67671 | 1.67522 | 1.67852 | 1.68449 | 1.67025 | 1.66688 | 1.65057 |
| $v_d$ | 45.65 | 45 | 44.94 | 45.65 | 45.12 | 45.06 | 44.67 | 48.52 | 46.83 |
| OEG/60 | 945° C. | 965° C. | 925° C. | 945° C. | 950° C. | 910° C. | 1030° C. | k.E. | 975° C. |
| VA | 944° C. | 941° C. | 935° C. | 944° C. | 937° C. | 915° C. | 945° C. | 947° C. | 961° C. |
| EW | 771° C. | 770° C. | 767° C. | 771° C. | 772° C. | 760° C. | 778° C. | 780° C. | 783° C. |
| Tg | 639° C. | 640° C. | 637° C. | 639° C. | 639° C. | 625° C. | 638° C. | 642° C. | 651° C. |
| T ($\eta = 10^2$ dPas) | 1080° C. | 1078° C. | 1075° C. | 1080° C. | 1080° C. | 1050° C. | 1094° C. | 1080° C. | 1100° C. |
| T ($\eta = 10^3$ dPas) | 1007° C. | 1002° C. | 998° C. | 1007° C. | 1005° C. | 970° C. | 1015° C. | 1005° C. | 1020° C. |

|  | X | XI | XII | XIII | XIV | XV | XVI | XVII | XVIII |
|---|---|---|---|---|---|---|---|---|---|
| $n_d$ | 1.67721 | 1.70242 | 1.69836 | 1.70186 | 1.69929 | 1.71435 | 1.71498 | 1.67882 | 1.73595 |
| $v_d$ | 47.54 | 43.97 | 44.14 | 44.33 | 44.38 | 43.6 | 43.63 | 44.92 | 42.01 |
| OEG/60 | k.E. | k.E. | k.E. | 965 | 925 | 855 | 890 | k.E. | 910 |
| VA | 932° C. | 840° C. | 836° C. | 852° C. | 847° C. | 842° C. | 833° C. | 935° C. | 825° C. |

-continued

| | | | | | | | | | |
|---|---|---|---|---|---|---|---|---|---|
| EW | 770° C. | 713° C. | 710° C. | 731° C. | 720° C. | 715° C. | 708° C. | 767° C. | 700° C. |
| Tg | 634° C. | 609° C. | 612° C. | 618° C. | 615° C. | 612° C. | 607° C. | 637° C. | 602° C. |
| T ($\eta = 10^2$ dPas) | 1070° C. | 990° C. | 972° C. | 1000° C. | 996° C. | 987° C. | 971° C. | 1075° C. | 958° C. |
| T ($\eta = 10^3$ dPas) | 995° C. | 897° C. | 896° C. | 918° C. | 910° C. | 900° C. | 892° C. | 998° C. | 880° C. | k.E. = devitrification not determined,
VA = processing temperature,
EW = softening temperature,
Tg = glass-transition temperature,
$\eta$ = viscosity It was possible for all example glasses to process them into thin glasses of this invention through in line manufacturing methods according to the present invention, without the occurrence of crystallization.

What is claimed is:

1. A thin glass having a thickness of less than 2 mm and comprising at least one fire-polished surface, wherein the at least one fire-polished surface has a root mean square roughness of at most 5 nm, the glass comprising:
   a refractive index of higher than 1.60; and
   components in % by mol of

| | from | to |
|---|---|---|
| $SiO_2$ | 30 | 60, |
| $B_2O_3$ | 0 | 20, |
| ZnO | 10 | 25, |
| BaO | 10 | 25; and | a molar ratio of quantities of BaO to ZnO that is lower than 1.5.

2. The thin glass according to claim 1, wherein $B_2O_3$ is present at a content of at least 6% by mol.

3. The thin glass according to claim 1, wherein the components further comprise in % by mol:

| | from | To |
|---|---|---|
| $Al_2O_3$ | 0 | 6, |
| CaO | 0 | 10, |
| SrO | 0 | 11, |
| MgO | 0 | 3, |
| $Na_2O$ | 0 | 10, |
| $K_2O$ | 0 | 8, |
| $Li_2O$ | 0 | 2, |
| $TiO_2$ | 0 | 9, |
| $ZrO_2$ | 0 | 5, |
| $Nb_2O_5$ | 0 | 3, |
| $La_2O_3$ | 0 | 10, and |
| $Y_2O_3$ | 0 | 7. |

4. The thin glass according to claim 3, wherein $B_2O_3$ is present at a content of at least 6% by mol.

5. The thin glass according to claim 3, further comprising a sum of the contents of BaO, SrO, CaO, MgO, and ZnO that is at least 30 and at most 50% by mol.

6. The thin glass according to claim 3, further comprising a sum of the contents of $TiO_2$, $ZrO_2$, $Y_2O_3$, $La_2O_3$, and $Nb_2O_5$ that is at least 2.5 and at most 12% by mol.

7. A layer composite assembly, comprising the thin glass according to claim 1 and at least one semiconductor layer.

8. An OLED, comprising the thin glass according to claim 1 and at least one semiconductor layer.

9. A substrate or superstrate, comprising the thin glass according to claim 1.

10. A thin glass having a thickness of less than 2 mm, the glass comprising:
    a refractive index of higher than 1.60; and
    components in % by mol:

| | from | To |
|---|---|---|
| $SiO_2$ | 43.5 | 49.5, |
| $B_2O_3$ | 6.0 | 9.0, |
| ZnO | 15 | 17, |
| BaO | 14.5 | 17.5, |
| CaO | 4.5 | 10, |
| $TiO_2$ | 2 | 6, |
| $ZrO_2$ | 0.5 | 4, and |
| $Nb_2O_5$ | 0.2 | 1.5. | a molar ratio of quantities of BaO to ZnO that is lower than 1.5.

11. A thin glass having a thickness of less than 2 mm and comprising at least one fire-polished surface, wherein the at least one fire-polished surface has a root mean square roughness of at most 5 nm, the glass comprising:
    a refractive index of higher than 1.60; and
    components in % by mol of

| | From | to |
|---|---|---|
| $SiO_2$ | 30 | 60, |
| $B_2O_3$ | 0 | 20, |
| ZnO | 10 | 25, and |
| BaO | 10 | 25; and | a molar ratio of quantities of BaO to ZnO that is lower than 1.5, and a molar ratio of quantities of $SiO_2$ to BaO that is at least 1.5 and at most 3.8.

12. The thin glass according to claim 11, wherein the molar ratio of quantities of $SiO_2$ to BaO that is at least 1.8 and at most 3.0.

13. The thin glass according to claim 11, wherein the molar ratio of quantities of $SiO_2$ to BaO that is at least 2.5 and at most 3.0.

14. The thin glass according to claim 11, wherein the components are free of $Li_2O$.

15. The thin glass according to claim 11, further comprising a sum of $SiO_2$ and $B_2O_3$ that is in a range of 40 to 65% by mol.

16. The thin glass according to claim 11, further comprising a sum of $SiO_2$ and $B_2O_3$ that is in a range of 48 to 55% by mol.

17. The thin glass according to claim 11, wherein the components comprise $SiO_2$ from 43.5 to 49.5 and $B_2O_3$ from 6.0 to 9.0.

18. A layer composite assembly, comprising a thin glass having a thickness of less than 2 mm, the glass comprising:
a refractive index of higher than 1.60; and
components in % by mol of

|  | From | To |
|---|---|---|
| $SiO_2$ | 30 | 60, |
| $B_2O_3$ | 6 | 20, |
| ZnO | greater than 12 | 25, |
| BaO | 10 | 25; and | a molar ratio of quantities of BaO to ZnO that is lower than 1.5, and
a molar ratio of quantities of $SiO_2$ to BaO that is at least 1.5 and at most 3.8, and at least one semiconductor layer.

19. An OLED, comprising a thin glass having a thickness of less than 2 mm, the glass comprising:
a refractive index of higher than 1.60; and
components in % by mol of

|  | From | To |
|---|---|---|
| $SiO_2$ | 30 | 60, |
| $B_2O_3$ | 6 | 20, |
| ZnO | greater than 12 | 25, |
| BaO | 10 | 25; and | a molar ratio of quantities of BaO to ZnO that is lower than 1.5, and
a molar ratio of quantities of $SiO_2$ to BaO that is at least 1.5 and at most 3.8, and at least one semiconductor layer.

* * * * *